(12) United States Patent
Matsumi et al.

(10) Patent No.: US 8,410,589 B2
(45) Date of Patent: Apr. 2, 2013

(54) LEAD FRAME, RESIN PACKAGE, SEMICONDUCTOR DEVICE AND RESIN PACKAGE MANUFACTURING METHOD

(75) Inventors: Yasuo Matsumi, Tsukuba (JP); Mitsuo Maeda, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 101 days.

(21) Appl. No.: 12/545,176

(22) Filed: Aug. 21, 2009

(65) Prior Publication Data

US 2010/0044844 A1    Feb. 25, 2010

(30) Foreign Application Priority Data

Aug. 22, 2008 (JP) ................ P2008-214349

(51) Int. Cl.
*H01L 23/495* (2006.01)
*H01L 23/48* (2006.01)
*H01L 23/52* (2006.01)
*H01L 29/40* (2006.01)

(52) U.S. Cl. ........ 257/667; 257/676; 257/690; 257/692; 257/773; 257/E21.502

(58) Field of Classification Search .......... 257/666, 257/667, 670, 690, 676, 692, 773, E21.502
See application file for complete search history.

(56) References Cited

U.S. PATENT DOCUMENTS

| | | | | |
|---|---|---|---|---|
| 5,766,649 | A * | 6/1998 | Azuma | 425/116 |
| 6,501,183 | B2 * | 12/2002 | Kanemoto et al. | 257/777 |
| 6,555,899 | B1 * | 4/2003 | Chung et al. | 257/670 |
| 6,603,194 | B2 * | 8/2003 | Utsumi et al. | 257/667 |
| 6,627,976 | B1 * | 9/2003 | Chung et al. | 257/666 |
| 6,737,735 | B2 * | 5/2004 | Ito | 257/667 |
| 6,911,719 | B1 * | 6/2005 | Yoshiike | 257/667 |
| 7,049,685 | B2 * | 5/2006 | James et al. | 257/669 |
| 2002/0037604 | A1 * | 3/2002 | Lee et al. | 438/112 |
| 2004/0207056 | A1 | 10/2004 | Seki et al. | |
| 2005/0245002 | A1 | 11/2005 | Danno | |
| 2006/0110855 | A1 * | 5/2006 | Kwan et al. | 438/123 |
| 2007/0262423 | A1 * | 11/2007 | Dimaano et al. | 257/667 |
| 2008/0029857 | A1 * | 2/2008 | Kiyohara et al. | 257/667 |
| 2009/0026595 | A1 * | 1/2009 | Kadoi | 257/676 |

FOREIGN PATENT DOCUMENTS

| | | |
|---|---|---|
| CN | 1344024 A | 4/2002 |
| JP | 5-315512 A | 11/1993 |
| JP | 6-188336 | 7/1994 |

(Continued)

OTHER PUBLICATIONS

Chinese Office Action for Chinese Patent Application No. 200910167356.3 dated Sep. 25, 2012, with English translation.

(Continued)

*Primary Examiner* — Teresa M Arroyo
(74) *Attorney, Agent, or Firm* — Sughrue Mion, PLLC

(57) ABSTRACT

A pressure loss section H1 (H2) extends from a position corresponding to a corner of a resin package, and S1 is the minimum value of the opening area of the pressure loss section H1 (H2) perpendicular to the direction of resin flow (X axis) in the pressure loss section H1 (H2) during resin molding, while S2 is the average value of the opening areas of excess resin reservoirs H3 to H5 perpendicular to the direction of resin flow (Y axis) within excess resin reservoir H3 to H5 during molding. In this lead frame, S1<S2 is satisfied.

5 Claims, 12 Drawing Sheets

FOREIGN PATENT DOCUMENTS

| | | |
|---|---|---|
| JP | 07-040389 A | 2/1995 |
| JP | 2000-058734 A | 2/2000 |
| JP | 2000-141411 A | 5/2000 |
| JP | 2004-332105 A | 11/2004 |
| JP | 2005-317829 A | 11/2005 |

OTHER PUBLICATIONS

Japanese Office Action for Japanese Patent Application No. P2009-190089 dated Jan. 8, 2013, with English translation.

* cited by examiner

LEAD FRAME, RESIN PACKAGE, SEMICONDUCTOR DEVICE AND RESIN PACKAGE MANUFACTURING METHOD

BACKGROUND OF THE INVENTION

1. Field of the Invention

The present invention relates to a lead frame, a resin package, a semiconductor device, and a resin package manufacturing method.

2. Related Background Art

Conventionally, a lead frame comprises a central die pad that is fixed to the main body of the lead frame by means of four suspended leads extending from the main body along the diagonal lines of the die pad. A plurality of die bonding leads are arranged around the die pad. The suspended leads may also be constructed so as to connect the die pad body to the outer frame.

Such a lead frame is described for example in Japanese Patent Application Laid-open No. H5-315512. The lead frame described in Japanese Patent Application Laid-open No. H5-315512 is provided with an open region through which resin material can escape when resin material is injected into the mold during resin molding.

However, resin packages manufactured using conventional lead frames are not always sufficiently airtight, and in the past, semiconductor devices obtained with such insufficiently airtight resin packages have not always been very reliable. Consequently, there is demand for high-quality resin packages with excellent air-tightness.

SUMMARY OF THE INVENTION

In light of these problems, it is an object of the present invention to provide a lead frame capable of forming a high-quality resin package, along with a high-quality resin package and a manufacturing method therefor.

The inventors in this case investigated lead frames to resolve these problems, and discovered that with conventional lead frames, the injected resin material divides into a plurality of resin streams as it flows from the injection site, and that welds tend to occur at the confluences, detracting from the quality of the manufactured resin package.

Therefore, the lead frame of the present invention is a lead frame applied during resin molding of a resin package having a polygonal plane shape, comprising: an outer frame, a plurality of bonding leads extending from the outer frame towards the inside thereof, a die pad disposed inside the outer frame and separated from the bonding leads, a plurality of connecting leads linking the outer frame with the die pad, an excess resin reservoir provided in the outer frame and holding excess resin during resin molding, and a pressure loss section for communicating between the excess resin reservoir and the space between the outer frame and die pad, wherein the pressure loss section extends from a position corresponding to one corner of the polygonal resin package, when the minimum value of the opening area of the pressure loss section perpendicular to a direction of resin flow in the pressure loss section during resin molding is defined as S1, and the average value of the opening area of the excess resin reservoir perpendicular to the direction of resin flow in the excess resin reservoir during resin molding is defined as S2, S1<S2 is satisfied. The polygonal shape includes, for example, a quadrangular shape.

When the lead frame is sandwiched between molds during resin injection and a resin material is injected from one corner into the space between the molds, the resin converges at a corner located on a line extending diagonally from this corner, but the excess resin reservoir communicates with this corner via the pressure loss section. That is, because the resin material that tends to accumulate in the corner is transported to the excess resin reservoir by means of the pressure loss section, not only is weld formation suppressed at the corner, but since the minimum value S1 of the opening area of the pressure loss section perpendicular to the direction of flow of the resin is small, the pressure loss section is able to maintain the resin pressure at a suitable level in the corner so that the resin material fills every part of the mold in that area.

In the lead frame of the present invention, moreover, it is desirable that t2<t1 given t1 as the thickness of the outer frame and t2 as the minimum depth of the pressure loss section. That is, the pressure loss section can be formed by half-etching or the like at the desired location. In this case, the opening area of the pressure loss section perpendicular to the direction of resin flow is smaller than the opening area perpendicular to the direction of resin flow would be in the case of a through hole formed with the same planar shape. This is why the pressure loss section can have the aforementioned effect of adequately controlling the resin flow.

In the lead frame of the present invention, those of the connecting leads that are close to the corners are preferably bent. Because the lead frame of the present invention is provided with a pressure loss section, the connecting leads are disposed so as to avoid the connection point of the pressure loss section, but the resin pressure exerted on the connecting leads during resin injection is reduced if the leads are bent, thereby preventing deformation of the connecting leads.

In the lead frame of the present invention, the bent connecting leads are each preferably formed from a first lead parallel to the bonding lead near this connection lead and a second lead following a diagonal line passing through the corners of the polygonal resin package. In this case, the flow of resin changes direction when it impacts the first lead during resin injection, and flows into the corner while extending from the first lead to the second lead. In the corner with the pressure loss section, welds are likely to occur due to collisions between two resin flows coming from different directions, but when the resin flow extends from the first lead to the second lead, weld formation is suppressed because the resin converges with the other resin flow at a position somewhat apart from the corner.

In the lead frame of the present invention, the surface of the lead frame is preferably black-oxide treated. Black-oxide treating the lead frame greatly strengthens the adhesive force between the resin material and the lead frame, making the lead frame less likely to detach from the manufactured resin package.

A resin package manufacturing method using the lead frame described above comprises a step of preparing the aforementioned lead frame, a step of disposing the lead frame within a space sandwiched between two opposing molds, and a step of injecting a resin material into the space.

Because the aforementioned lead frame is used in this manufacturing method it is possible to suppress the occurrence of welds at the corners.

The resin material is preferably a liquid crystal polymer in the resin package manufacturing method of the present invention. The advantage of using a liquid crystal polymer is that it allows a highly rigid resin package to be manufactured.

In the resin package manufacturing method of the present invention, the temperature T1 (° C.) of the mold during injection of the resin material and the flow initiation temperature T2 (° C.) of the resin material are preferably such that T1 (° C.)≧T2 (° C.)−70 (° C.). If the resin is injected under these temperature conditions, enough resin will flow into the mold to form a resin molded body with a regular appearance. This also increases the adhesive strength between the lead frame and the resin.

In the resin package of the present invention, the lead frame is also embedded in the resin material in such a way that the surfaces of the die pad and parts of the bonding leads are exposed to air. This resin package is of high quality because weld formation is suppressed.

The semiconductor device of the present invention is provided with the resin package described above and a semiconductor element fixed to the die pad. Because of the high quality of the resin package, this semiconductor device is resistant to deterioration of the semiconductor element due to deterioration of the resin package.

The lead frame of the present invention makes it possible to form a high-quality resin package, and a resin package manufactured using the lead frame of the present invention is of high quality.

DESCRIPTION OF THE PREFERRED EMBODIMENTS

A lead frame of an embodiments, a resin package using this lead frame and a manufacturing method therefor are explained below. In the following explanations identical elements are identified with identical symbols, and redundant explanations are omitted.

Figure 1:
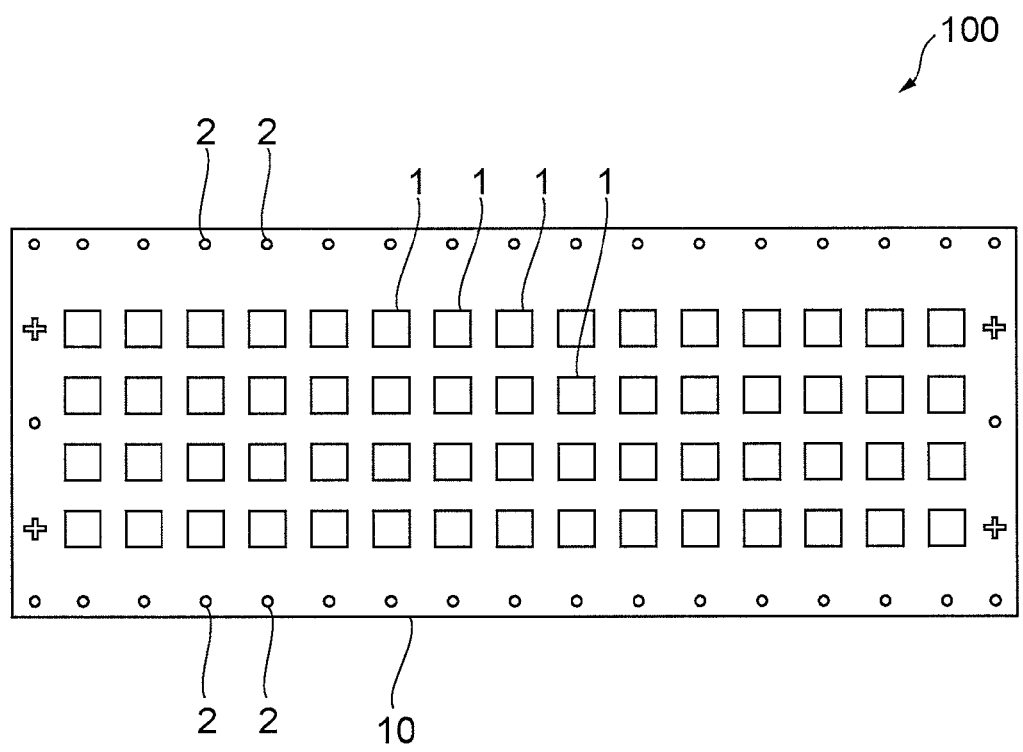
FIG. 1 is a plane view of a lead frame.
Figure 1:
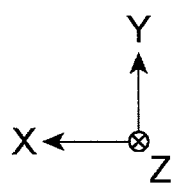

FIG. 1 is a plane view showing lead frame 100 of an embodiment. The X axis, Y axis and Z axis in this figure form a three-dimensional Cartesian coordinate system.

Lead frame 100 comprises lead frame body 10 consisting of a flexible metal plate on which a plurality of unit patterns 1 are arranged in a matrix. In this figure, there are 15 unit patterns 1 in the X-axis direction and 4 in the Y-axis direction, for a total of 60 unit patterns 1 on one lead frame 100. One resin package is formed within each unit pattern 1. That is, lead frame 100 is applied during resin molding of a resin package.

Both ends of lead frame body 10 in the Y-axis direction are provided with a plurality of holes 2 into which pins are inserted in order to position lead frame 100 and transport lead frame 100 in the X-axis direction. The Z axis is the direction of thickness of lead frame 100.

Figure 2:
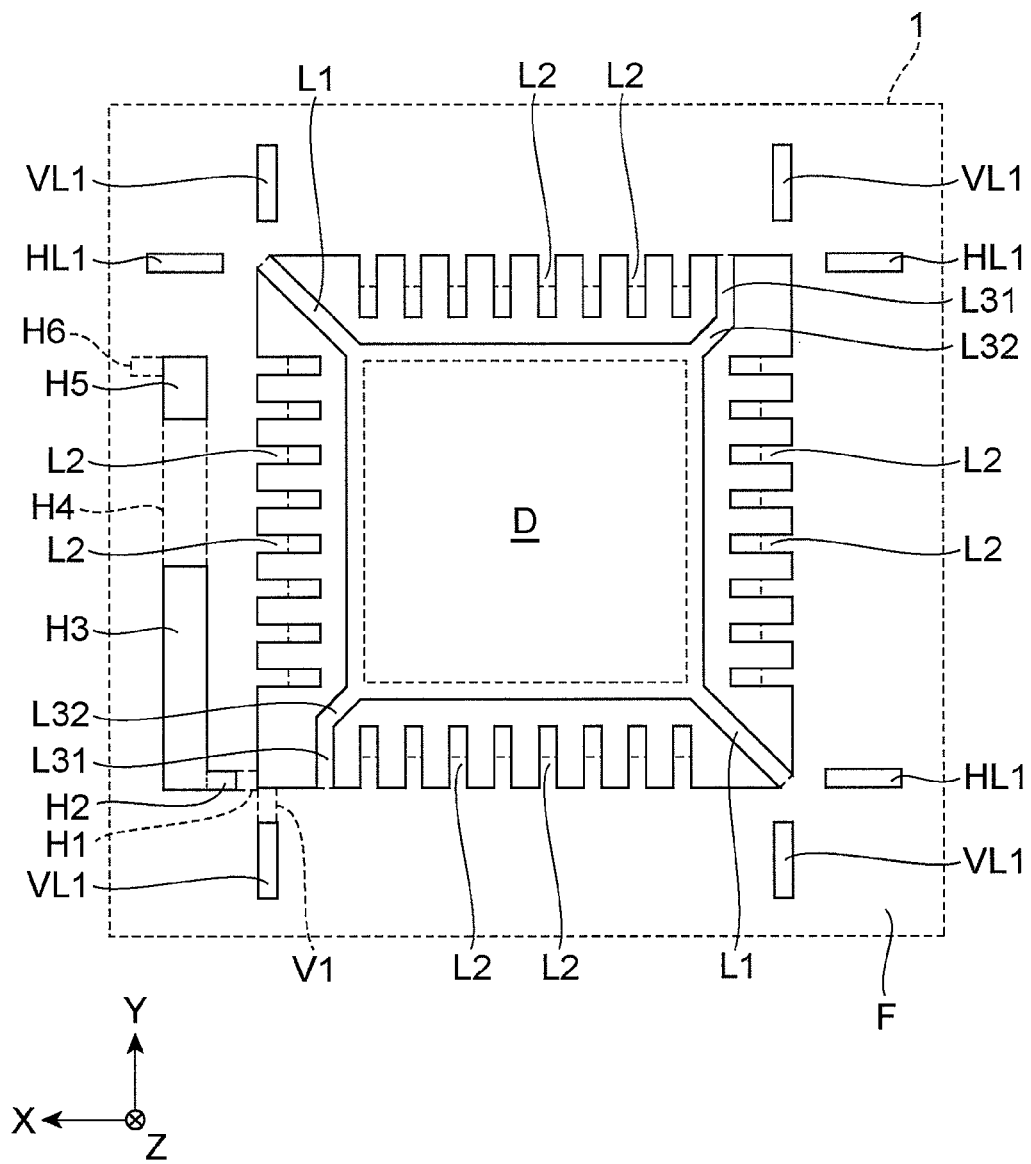
FIG. 2 is a plane view of unit pattern 1 (front) in the lead frame.

FIG. 2 is a plane view of a unit pattern 1 (front) in the lead frame.

Outer frame F of the lead frame body is located on the outside of unit pattern 1. Unit pattern 1 is provided with outer frame F, a plurality of bonding leads L2 extending from outer frame F towards the inside, die pad (island) D arranged inside outer frame F without touching bonding leads L2, a plurality of connection leads L1 (L31, L32) linking outer frame F and die pad D, excess resin reservoirs H3, H4 and H5 in outer frame F for holding excess resin during resin molding, and pressure loss sections H1 and H2, which communicate between excess resin reservoir H3 and the space between outer frame F and die pad D. Connection leads are also called suspended leads.

The inner edge of outer frame F is square or rectangular, die pad D is also square or rectangular, and bonding leads L2 extend in four directions perpendicular to the four sides of these squares or rectangles. Bonding leads L2 and the semiconductor element fixed in the center of die pad D are connected by bonding wires (not shown). Using this lead frame, a resin package is manufactured having a plane shape with 4 sides roughly parallel to the 4 sides of square or rectangular die pad D. The resin package can also be made in the shape of a polygon other than a quadrangle.

Pressure loss sections H1 and H2 extend from a position corresponding to one corner of a resin package with a polygonal plane shape. During the resin injection step of resin molding, resin material flows into pressure loss sections H1 and H2 in the direction of the X axis. S1 is the minimum value of the opening areas of pressure loss sections H1 and H2 perpendicular to the direction of resin flow (X-axis direction) in the pressure loss sections during resin molding. S2 is the average value of the opening areas of excess resin reservoirs H3, H4 and H5 perpendicular to the direction of resin flow (Y-axis direction) in excess resin reservoirs H3, H4 and H5 during resin molding. S1 is less than S2. Groove H6, which is used to suction out internal gas during resin molding, is connected on the reverse side to the end of excess resin reservoir H5. Groove 6 extends in the X-axis direction, and a gas suction conduit is provided in the mold above this groove, with the suction outlet of this conduit in groove 6.

Pressure loss section H2 and excess resin reservoirs H3 and H5 are through holes penetrating from the front to the reverse of outer frame F of the lead frame in the direction of thickness (Z-axis direction).

Figure 3:
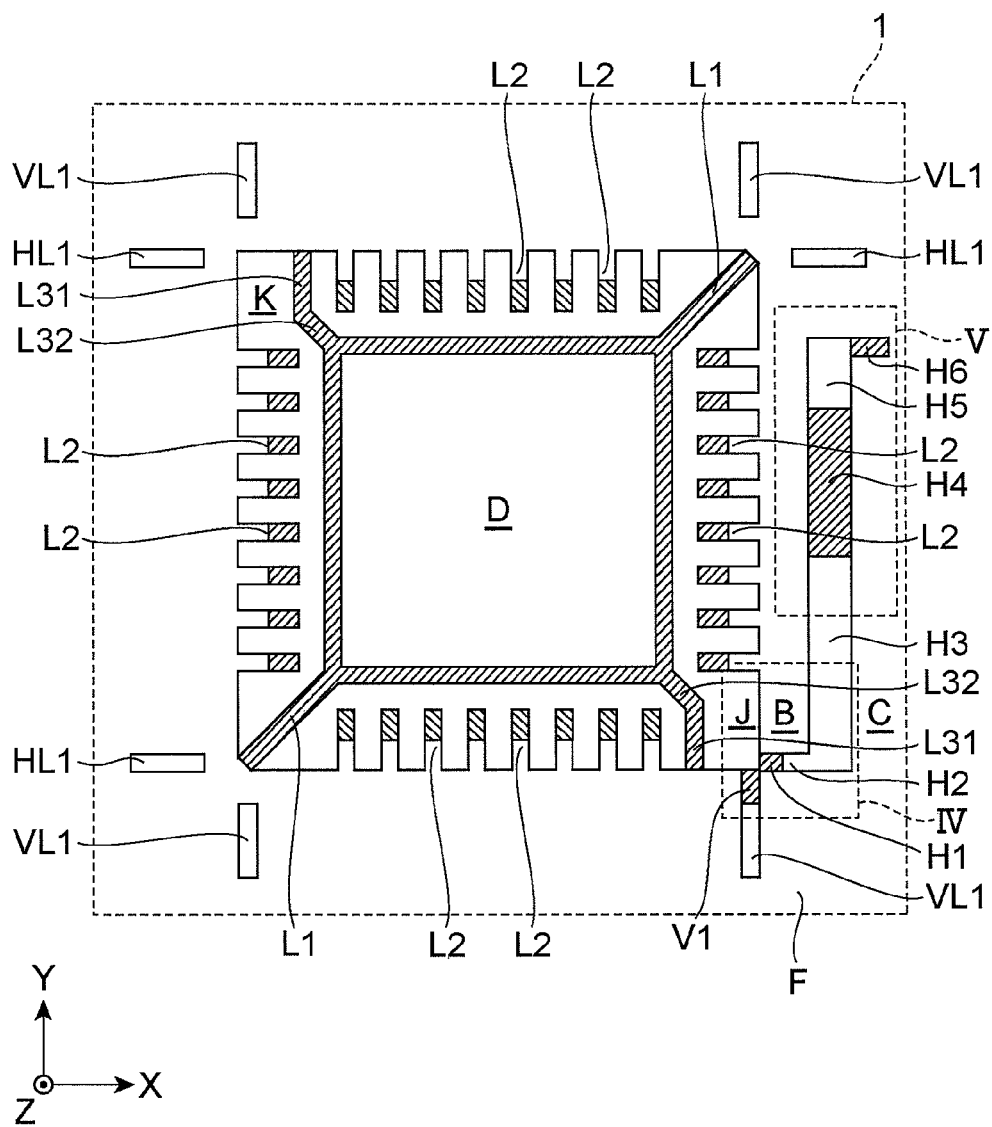
FIG. 3 is a plane view of unit pattern 1 (reverse) in the lead frame.

FIG. 3 is a plane view of a unit pattern 1 (reverse) in the lead frame.

Pressure loss section H1, excess resin reservoir H4 and gas suction groove H6 consist of grooves formed on the reverse side of the lead frame by half-etching of the reverse surface. The half-etched region is shown by shading. The ends of bonding leads L2, the edges of die pad D and connection leads L1 (L31, L32) are also half-etched. When the lead frame is made of copper, a cupric chloride solution for example can be used as the solution for copper half-etching. Pressure loss section H1 is positioned at a corner of the resin package, and is connected (communicates) with roughly quadrangular space J between outer frame F and one corner of die pad D. Pressure loss section V1 consisting of a groove formed by half-etching of the same reverse surface is connected to this space J. Pressure loss sections H1 and H2 extend in the X-axis direction, but pressure loss section V1 extends in the Y-axis direction and connects to rectangular opening VL1.

Opening VL1 is a through hole penetrating between the front and reverse of the lead frame, and its longer direction is the Y-axis direction. Opening HL1 is a through hole penetrating between the front and reverse of the lead frame, and its longer direction is the X-axis direction. These openings VL1 and HL1, which extend from each corner of the resin package being molded towards the outside, serve as guidelines for cutting the lead frame, and also make it easier to cut the lead frame at these points because they are weaker.

Excess resin reservoirs H3 through H5 are positioned between outer region C and inner region B of outer frame F, with a plurality of bonding leads L2 extending from inner region B, and space J adjoining inner region B.

Figure 4:
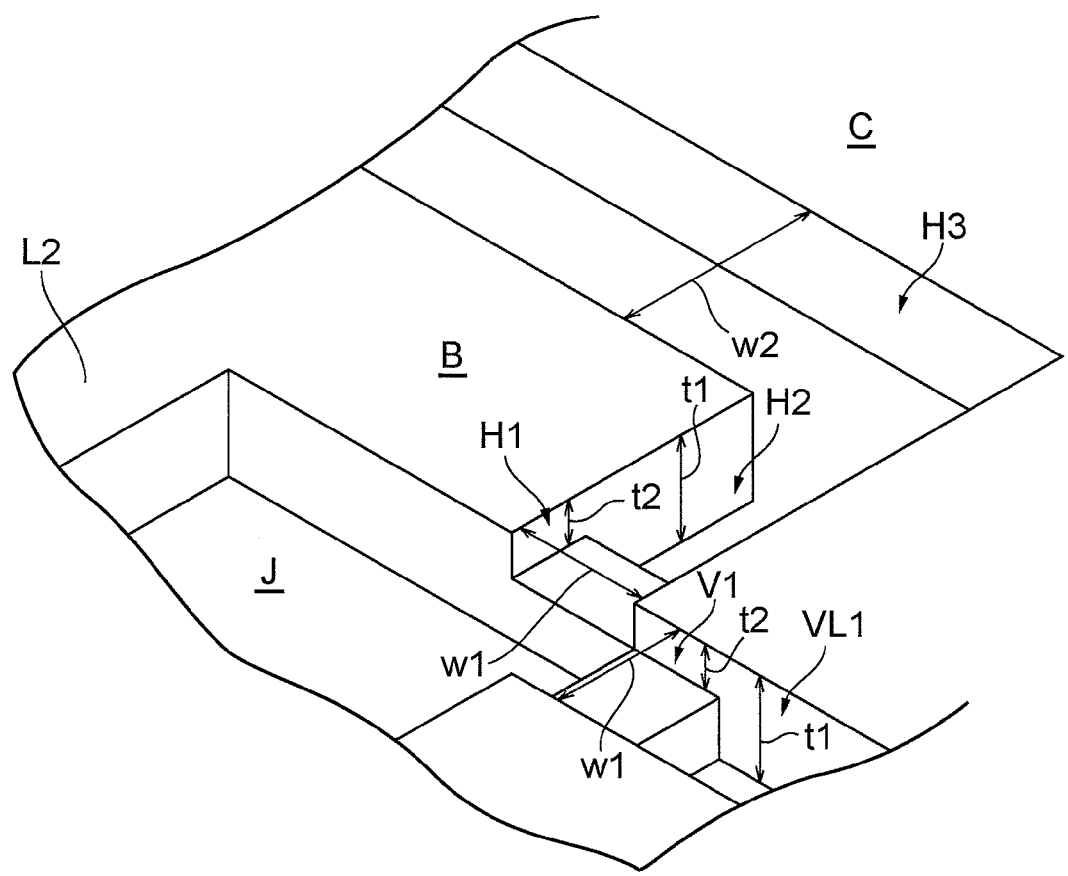
FIG. 4 is an expanded oblique view of region IV shown in FIG. 3.

FIG. 4 is an expanded oblique view of region IV in FIG. 3.

Pressure loss section H1 is a groove that communicates with space J, and pressure loss section H2 is a through hole connected to pressure loss section H1. Pressure loss section H1 has width w1 and depth t2, and its opening area perpendicular to the X axis is (w1×t2). Pressure loss section H2 has width w1 and depth t1, and its opening area perpendicular to the X axis is (w1×t1). Because t1>t2, the minimum value S1 of the opening areas of pressure loss sections H1 and H2 perpendicular to the X axis is w1×t2. Pressure loss section H2 communicates with excess resin reservoir H3.

Excess resin reservoir H3 has width w2 and depth t1, and its opening area S2 (H3) perpendicular to the direction of resin flow (Y-axis direction) is w2×t1. W2 here is greater than w1, and t1 is the thickness of the outer frame. Pressure loss section V1 with width w1 and depth t2 communicates with space J, and pressure loss section V1 is also connected to opening VL1 with width w1 and depth t1.

The resin material flowing outwards from space J is constrained most strongly by pressure loss section H1, and less strongly by pressure loss section H2, before arriving at excess resin reservoir H3. Part of the resin material flowing outwards from space J is strongly constrained by pressure loss section V1 before arriving at opening VL1.

Thus, outer frame F has thickness t1, pressure loss section H1 has minimum depth t2, and t2 is less than t1. Pressure loss section H1 can be formed by half-etching at that location, and the opening area of pressure loss section H1 perpendicular to the direction of resin flow is smaller than it would be if a through hole with the same plane shape was formed in the outer frame. Consequently, pressure loss section H1 can provide the effects described above by adequately constraining the flow of resin.

Figure 5:
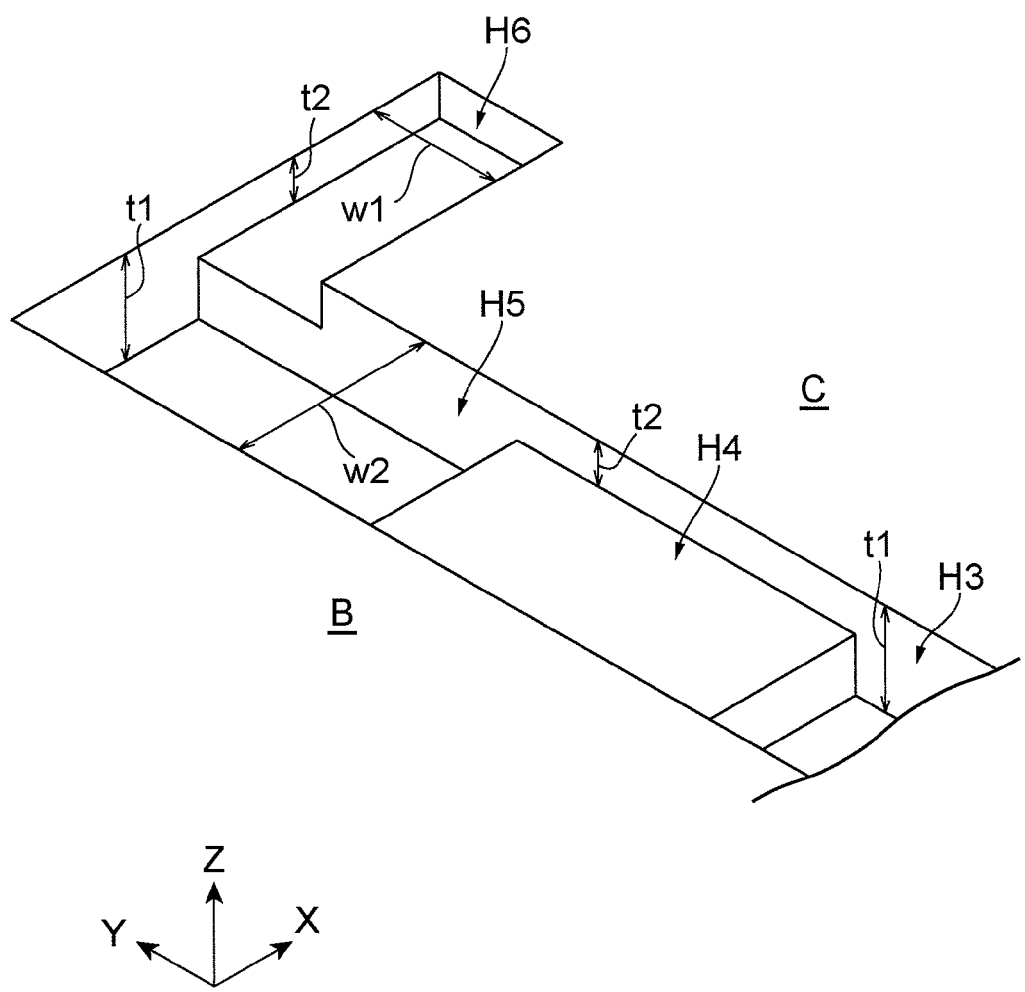
FIG. 5 is an expanded oblique view of region V shown in FIG. 3.

FIG. 5 is an expanded oblique view of region V in FIG. 3.

Excess resin reservoir H4, which functions as a pressure loss section, is connected to the latter stage of excess resin reservoir H3, and excess resin reservoir H4 has width w2 and depth t2. That is, the flow of resin would be hard to control if the space inside excess resin reservoir H3 were connected without restrictions, but since the latter stage of excess resin reservoir H3 is connected to excess resin reservoir H4, which has a small opening area perpendicular to the Y-axis direction, the unrestricted resin flow can be constrained, thereby preventing any extreme drop in the resin pressure within the resin package-forming space. The opening area S2 (H4) of excess resin reservoir H4 perpendicular to the direction of resin flow (Y-axis direction) is w2×t2.

Excess resin reservoir H5 is connected as a through hole to excess resin reservoir H4, and excess resin reservoir H5 has width w2 and depth t1, providing a large opening area S2 (H5) of w2×t1 perpendicular to the Y-axis direction which allows sufficient resin to accumulate. Groove H6 with width w1 and depth t2 is connected to excess resin reservoir H5, and the opening area in groove 6 perpendicular to the X-axial direction in which the resin flows is w1×t2.

The ratio of the lengths of excess resin reservoirs H3, H4 and H5 in the Y-axis direction is 3:2:1 for example, and the average value of the opening areas S2 perpendicular to the Y axis ($\{S2(H3) \times 3 + S2(H4) \times 2 + S2(H5) \times 1\}/6$) is greater than the minimum value S1 of the opening areas of the pressure loss sections. When opening areas S2 vary continually along the Y axis, the average value of opening areas S2 can be calculated by first multiplying the area S2 of each tiny section along the Y axis by the number of tiny sections, and then dividing by the number of tiny sections. The upper and lower surfaces of the lead frame shown in FIGS. 4 and 5 are in contact with the flat surfaces of the upper and lower molds during resin injection, and the shape that defines each of the opening areas described above is a rectangle.

Figure 6:
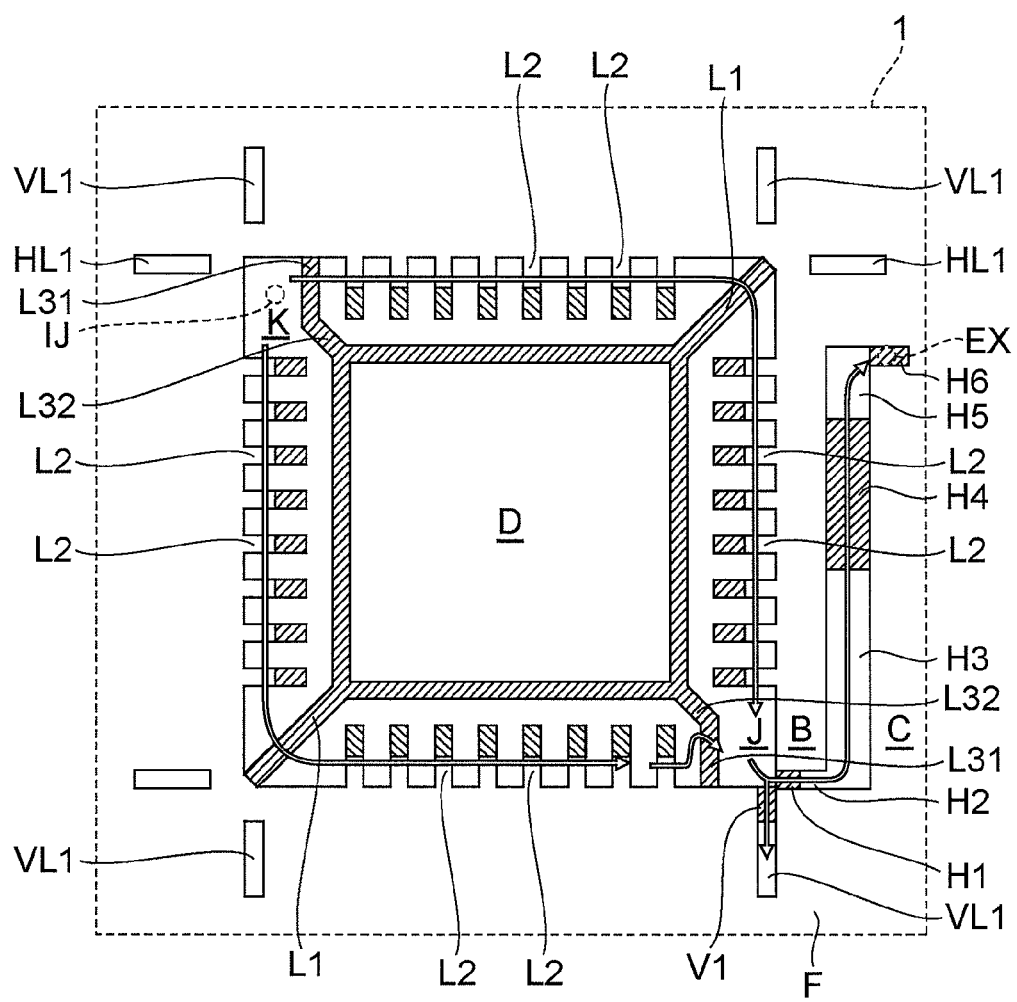
FIG. 6 is a plane view of unit pattern 1 (reverse) for purposes of explaining the flow of resin material.

FIG. 6 is a plane view of unit pattern 1 (reverse) for explaining the flow of resin material.

When resin is injected, the lead frame is sandwiched between a pair of molds having facing surfaces perpendicular to the Z axis, and resin material is injected into the space between molds from resin injection gate IJ provided in space K at one corner of the resin package. Resin injection gate IJ is provided in one of the molds, and in this case it is provided on the reverse side of the resin package. Resin material converges as shown by the arrows on space J in the corner diagonally across from space K, and excess resin reservoirs H3 through H5 are connected via pressure loss sections H1 and H2 to this corner space J.

That is, resin material that would otherwise tend to accumulate in this corner space J is instead transported to excess resin reservoirs H3 through H5 by means of pressure loss sections H1 and H2, thereby inhibiting the formation of welds at this corner. Because the minimum value S1 of the opening areas of pressure loss sections H1 and H2 perpendicular to the direction of resin flow is small, pressure loss sections H1 and H2 can maintain the resin pressure in this corner space J at a suitable level so that the resin material fills the surrounding area completely. Some of the resin material also arrives at the inside of opening VL1 via pressure loss section V1.

The two connection leads L1 extend along a diagonal line connecting two corners of the die pad, and these connection leads L1 are connected to outer frame F. The remaining connection leads L31 and L32 are located closer to corner spaces K and J than these connection leads L1, and are bent. Because this lead frame is provided with pressure loss sections H1 and H2, connection leads L31 and L32 are arranged so as to avoid the connection site of pressure loss section H1. The resin pressure exerted on connection leads L31 and L32 during resin injection is reduced by the bends in these connection leads, thereby inhibiting deformation of connection leads L31 and L32.

The bent connection leads L31 and L32 consist of first leads L31 parallel to the bonding leads L2 adjacent to connection leads L31 and L32, and second leads L32 extending along a diagonal line passing through corners of the polygonal resin package. In this case, the flow of resin changes direction when it impacts first lead L31 during resin injection, and flows into corner space J while extending from first lead L31 to second lead L32. Welds are likely to occur due to collision between two resin flows flowing from different directions into corner space J having pressure loss section H1, but a resin flow that extends from first lead L31 to second lead L32 will converge with another resin flow at a position somewhat apart from the corner as shown by the arrow, thereby inhibiting the formation of welds.

The ends of the reverse faces of bonding leads L2 and the reverse faces of first leads L31 and second leads L32 are formed by half-etching, and these half-etched regions allow the passage of resin material even when sandwiched between molds.

Figure 7:
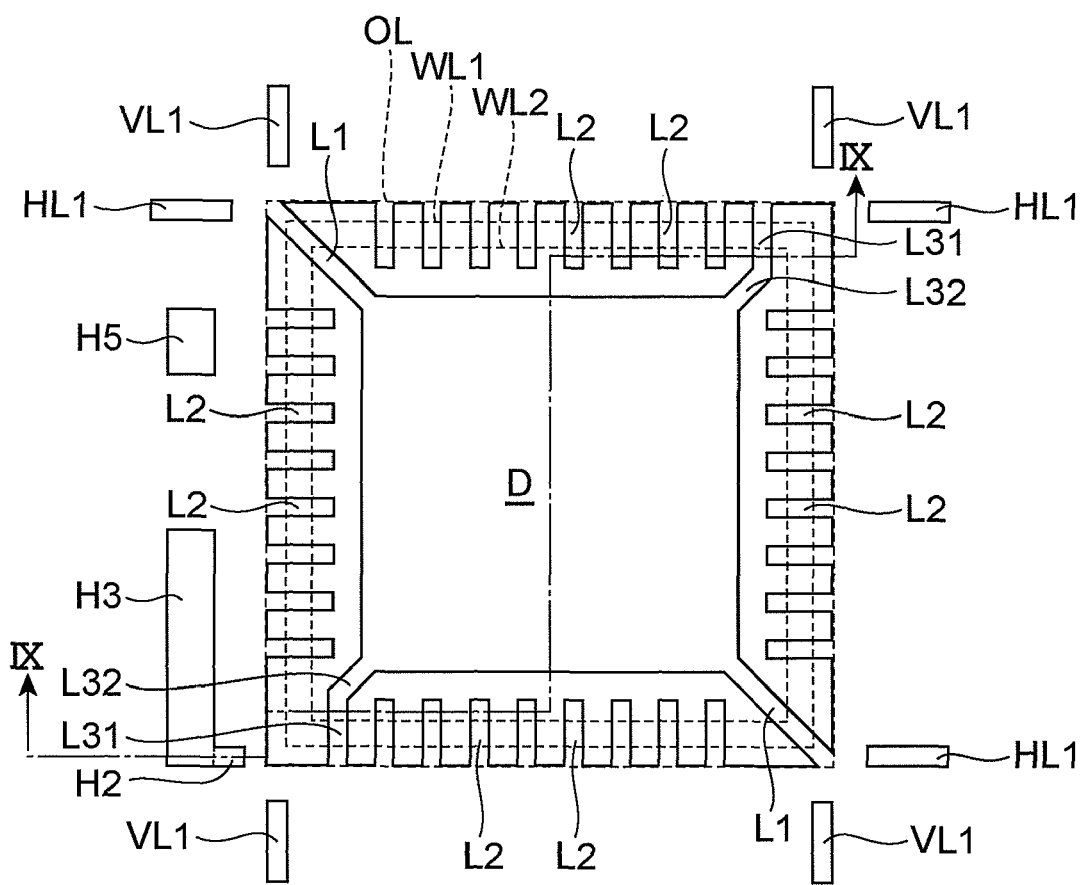
FIG. 7 is a plane view of a resin package.

FIG. 7 is a plane view of a resin package.

The resin material is shown by dotted lines. The plane shape of the resin package is roughly square, with an indented center that is defined by four side walls. The space between outer surface WL1 and inner surface WL2 of these side walls is filled with resin, and during resin molding resin fills the roughly square region OL which is surrounded by four straight lines following the long directions of openings HL1 and VL1. This roughly square region OL defines the resin-filled space between molds. The lead frame together with the resin is cut along the outer edge of this roughly square region OL or in other words along the outer surfaces of the side walls of the resin package during molding, thereby completing the resin package. The outer sides of the package can be polished as necessary.

Figure 8:
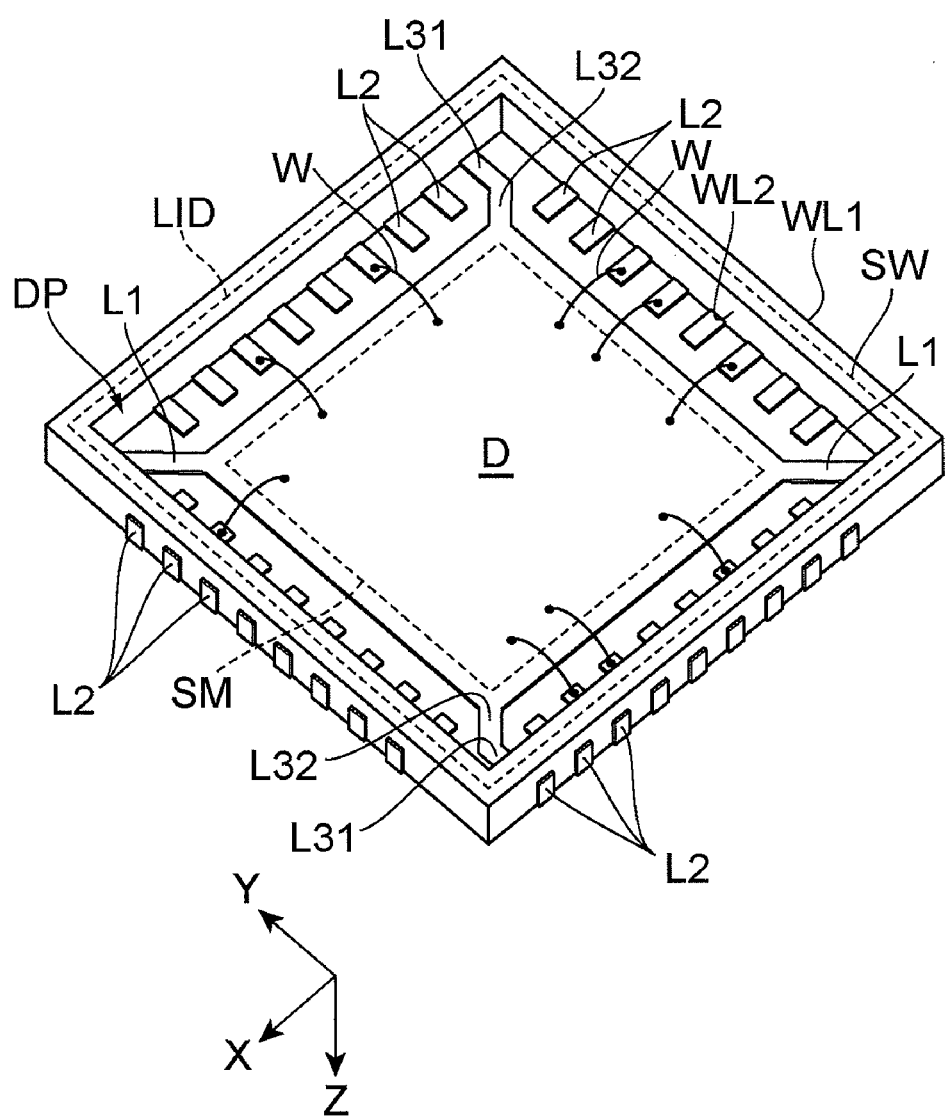
FIG. 8 is an oblique view of a resin package.

FIG. 8 is an oblique view of a resin package.

Die pad D is located inside indentation DP at the center of the resin package. The surfaces of die pad D and parts of bonding leads L2 of the lead frame are exposed to air, while the rest of the lead frame is embedded in the resin material. Bonding leads L2 are partly embedded in the bottom of side wall SW. Semiconductor element SM is die-bonded onto die pad D, and this semiconductor element SM is electrically connected by bonding wires W to the exposed surfaces of bonding leads L2. Because the uncut lead frame is provided with pressure loss sections and the like, weld formation is suppressed and the resulting resin package is of high quality.

A lid (LID) consisting of a transparent flat plate is fixed to the tops of side walls SW, ensuring the air-tightness of the package. In this way, a semiconductor device of an embodiment is provided with the resin package described above together with a semiconductor element SM fixed to die pad D. Because of the high quality of the resin package, this semiconductor device is resistant to deterioration of the semiconductor element due to deterioration of the resin package. The lid (LID) consists of a transparent material when semiconductor element SM is an optical element or optical sensor, but in other cases may consist of an opaque material.

Figure 9:
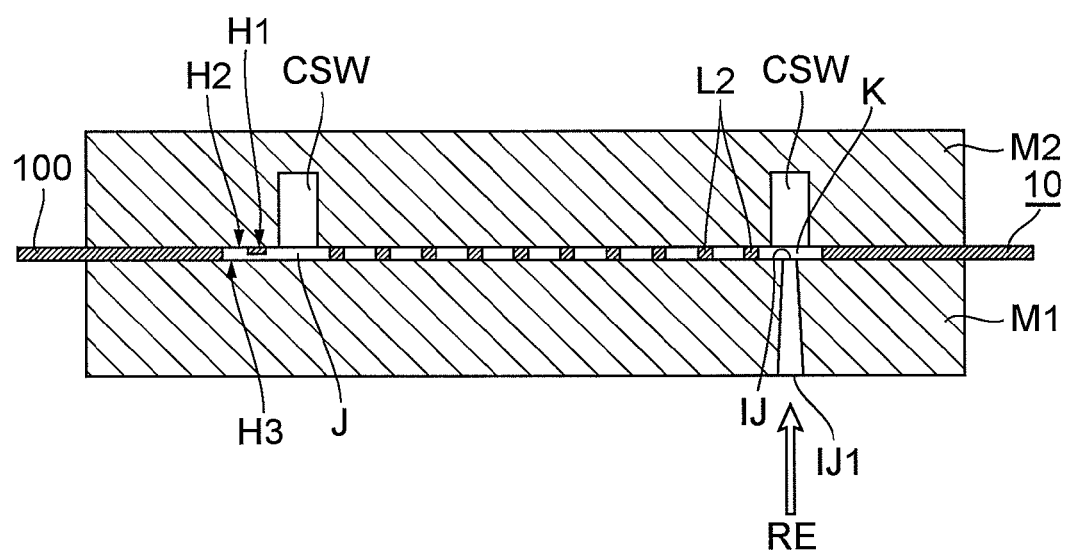
FIG. 9 is a cross-section along arrows IX-IX in the resin package shown in FIG. 7.
Figure 9:
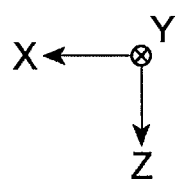

FIG. 9 is a cross-section of the package shown in FIG. 7 along arrows IX-IX, showing lead frame 100 sandwiched between molds M1 and M2.

Lead frame 100 is made of copper, and its surface has been black-oxide treated. An aqueous solution containing sodium chlorite, trisodium phosphate and sodium hydroxide for example can be used for the black-oxide treatment solution. Black-oxide treating the lead frame dramatically increases the adhesive strength between the resin material and the lead frame, making the manufactured resin package less likely to detach from the lead frame.

When manufacturing a resin package, such a lead frame 100 is prepared and then sandwiched between two facing molds M1 and M2. That is, lead frame 100 is arranged in the space between molds M1 and M2. The resin material RE in this space is injected via resin injection gate IJ. Resin injection gate IJ is the outlet of a resin injection conduit provided in mold M1, and this resin injection conduit also has inlet IJ1 for resin material RE provided on the outside of mold M1. The facing surfaces of molds M1 and M2 are flat on the outside of rectangular region OL (see FIG. 7), but project as rectangular columns in the area corresponding to indentation DP of the resin package inside rectangular region OL (see FIG. 8), with those parts corresponding to the side walls forming indented spaces CSW as oblong grooves.

When resin material is injected from resin injection gate IJ into space K in the corner sandwiched between molds M1 and M2, the resin material follows the gaps between leads L2 and side-wall space CSW corresponding to side walls SW, arriving at space J. After this, part of the excess resin material arrives at excess resin reservoir H3 by way of pressure loss sections H1 and H2. With this manufacturing method, occurrence of welds inside corner space J is suppressed by using the lead frame 100 described above.

Temperature T1 (° C.) of the molds during injection of the resin material and resin material flow initiation temperature T2 (° C.) are such that T1 (° C.)≧T2 (° C.)−70 (° C.). When resin material is injected under such temperature conditions, enough resin flows inside molds M1 and M2 to form a resin molded body with a regular appearance. In particular, it is possible to manufacture a highly rigid resin package using a liquid crystal polymer as the resin material. Another advantage is that the adhesive strength between the lead frame and resin is increased. Moreover, since liquid crystal polymers ordinary have low hygroscopicity, the reliability of the semiconductor element on die pad D can be maintained, and burr can be controlled, which should result in improved resin package productivity.

For example, the space between the molds is filled with a melted liquid crystal polymer (Sumitomo Chemical E6008, flow initiation temperature T2=320° C.) when the temperature T1 of both molds reaches 300° C. After this, the resulting resin molded body is removed from the molds when the mold temperatures reach 252° C. After the resin package has been molded, the oxidized copper is stripped from the black-oxide treated surface, which is then given a conductive plate of Au or the like to complete the resin package.

Figure 10:
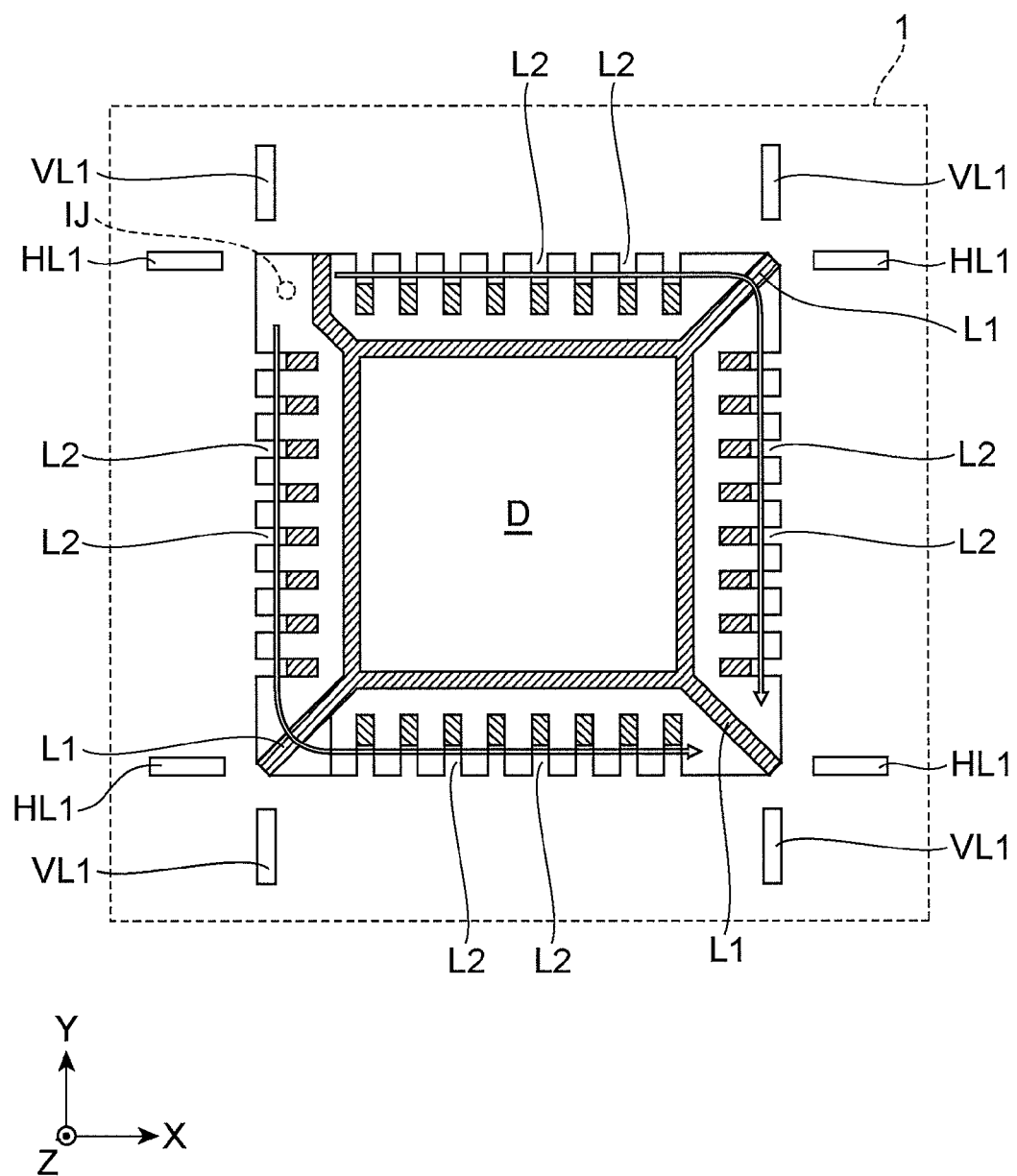
FIG. 10 is a plane view of a unit pattern (reverse) of a comparative example.

FIG. 10 is a place view of a unit pattern (reverse) of a comparative example.

In this unit pattern 1, 4 connection leads extend along the diagonals from the 4 corners of die pad D. When resin is injected from injection gate IJ in this configuration, the resin flows converge at the diagonal as shown by the arrows, forming a weld.

Using the lead frame of the embodiment described above, on the other hand, because welds do not form easily, it is possible to form a high-quality resin package, and a resin package manufactured using this lead frame is of high quality.

It is desirable to use a thermoplastic resin as the resin material, and examples of such thermoplastic resins include polystyrene resin, acrylic resin, polycarbonate resin, polyester resin, polyamide resin, polyacetal resin, polyphenylene ether resin, fluorine resin, polyphenylene sulfide resin, polysulphone resin, polyarylate resin, polyetherimide resin, polyethersulphone resin, polyetherketone resin, liquid crystal polyester resin, polyamideimide resin, polyimide resin and the like, with polyester resin, polyamide resin, polyphenylene sulfide resin and liquid crystal polyester resin being preferred, and liquid crystal polyester resin (liquid crystal polymer) being especially preferred from the standpoint of fluidity, heat resistance and rigidity. These resins can be used individually, or more than one can be used simultaneously.

A suitable inorganic filler can also be mixed with this resin material.

Examples of inorganic fillers that can be mixed with the resin material include glass fiber (milled glass fiber, chopped glass fiber and the like), glass beads, hollow glass spheres, glass powder, mica, talc, clay, silica, alumina, potassium titanate, wollastonite, calcium carbonate, magnesium carbonate, sulfate of soda, calcium sulfate, barium sulfate, calcium sulfite, aluminum hydroxide, magnesium hydroxide, calcium hydroxide, calcium silicate, quartz sand, silica stone, quartz, titanium oxide, zinc oxide, iron oxide, graphite, molybdenum, asbestos, silica alumina fiber, alumina fiber, plaster fiber, carbon fiber, carbon black, white carbon, diatomaceous earth, bentonite, sericite, shirasu (volcanic ash), black lead and other inorganic fillers, and potassium titanate whiskers, alumina whiskers, aluminum borate whiskers, silicon carbonate whiskers, silicon nitride whiskers and other metal whiskers or non-metal whiskers and the like.

Figure 11:
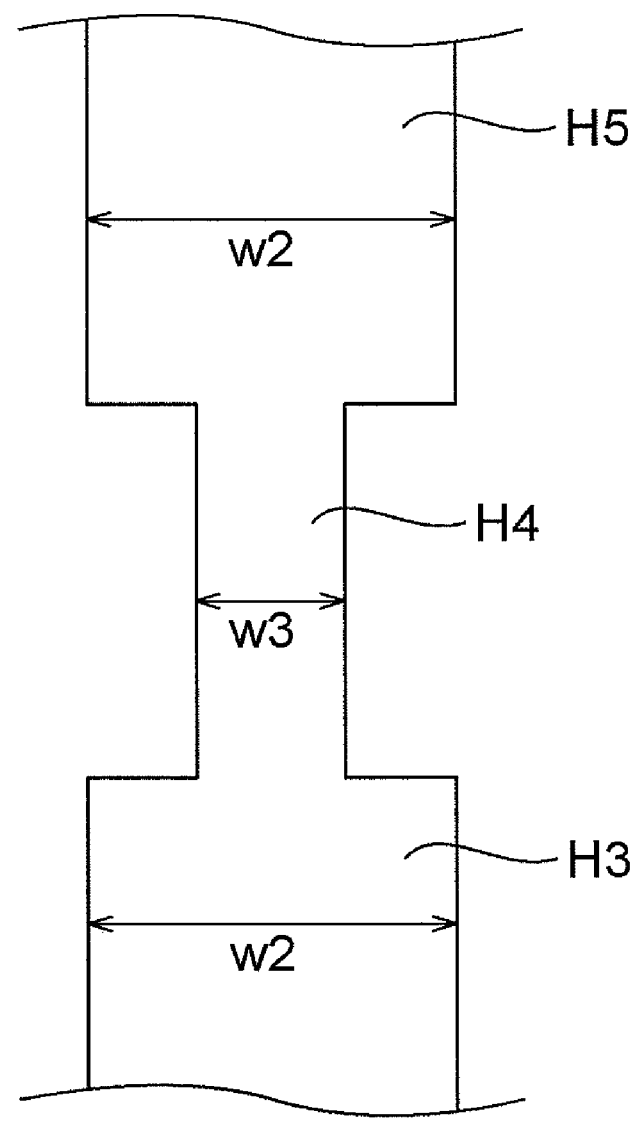
FIG. 11 is a plane view of a specific lead frame site showing a variant of excess resin reservoir H4.

FIG. 11 is a plane view of a specific lead frame site showing a variant of excess resin reservoir H4, which functions as a pressure loss section.

The excess resin reservoir H4 described previously was formed by half etching of the lead frame, but excess resin reservoir H4 can be made to function as a pressure loss section if its width w3 is made smaller than width w2. In this case, excess resin reservoir H4 can be formed after half etching, or from a through hole. Similar variants of pressure loss sections are also possible in other places.

Examples of the aforementioned resin package are described next.

(Manufacturing the Resin Package)

Example 1

The lead frame shown in FIGS. 2 and 3 was prepared, and this lead frame was black-oxide treated by being immersed in an aqueous solution containing sodium chlorite, trisodium phosphate and sodium hydroxide. Next, the black-oxide treated lead frame was arranged in the space between molds M1 and M2. The molds were heated, and the space between the molds was filled with liquid crystal polymer (Sumitomo Chemical E6008, flow initiation temperature T2=320° C.) when the temperatures (T1) of both molds M1 and M2 reached 300° C. The molds were then cooled, and once the mold temperatures reached 252° C. the molded resin package was removed from the molds.

Example 2

A resin package was manufactured as in Example 1 except that a lead frame having a through hole substituted for groove H6 formed by half-etching was used as the lead frame shown in FIGS. 2 and 3.

Example 3

A resin package was manufactured as in Example 1 except that a lead frame having a through holes substituted for excess resin reservoir H4 and groove H6 was used as the lead frame shown in FIGS. 2 and 3.

Comparative Example 1

A resin package was manufactured as in Example 1 except that a lead frame having through holes substituted for pressure loss sections H1 and groove H6 was used as the lead frame shown in FIGS. 2 and 3.

Comparative Example 2

A resin package was manufactured as in Example 1 but using the lead frame shown in FIG. 10.

Example 4

All was done as in Example 1 except that the space between molds M1 and M2 was filled with the melted liquid crystal polymer at the point when the temperature (T1) of molds M1 and M2 reached 261° C.

Example 5

A resin package was manufactured as in Example 2 except that the space between molds M1 and M2 was filled with the melted liquid crystal polymer at the point when the temperature (T1) of molds M1 and M2 reached 261° C.

Example 6

A resin package was manufactured as in Example 3 except that the space between molds M1 and M2 was filled with the melted liquid crystal polymer at the point when the temperature (T1) of molds M1 and M2 reached 261° C.

Comparative Example 3

A resin package was manufactured as in Comparative Example 1 except that the space between molds M1 and M2 was filled with the melted liquid crystal polymer at the point when the temperature (T1) of molds M1 and M2 reached 261° C.

Comparative Example 4

A resin package was manufactured as in Comparative Example 2 except that the space between molds M1 and M2 was filled with the melted liquid crystal polymer at the point when the temperature (T1) of molds M1 and M2 reached 261° C.

(Air-tightness test) Air-tightness testing was next performed using the resin packages of Examples 1 through 6 and Comparative Examples 1 through 4.

This air-tightness testing was performed as follows.

Figure 12:
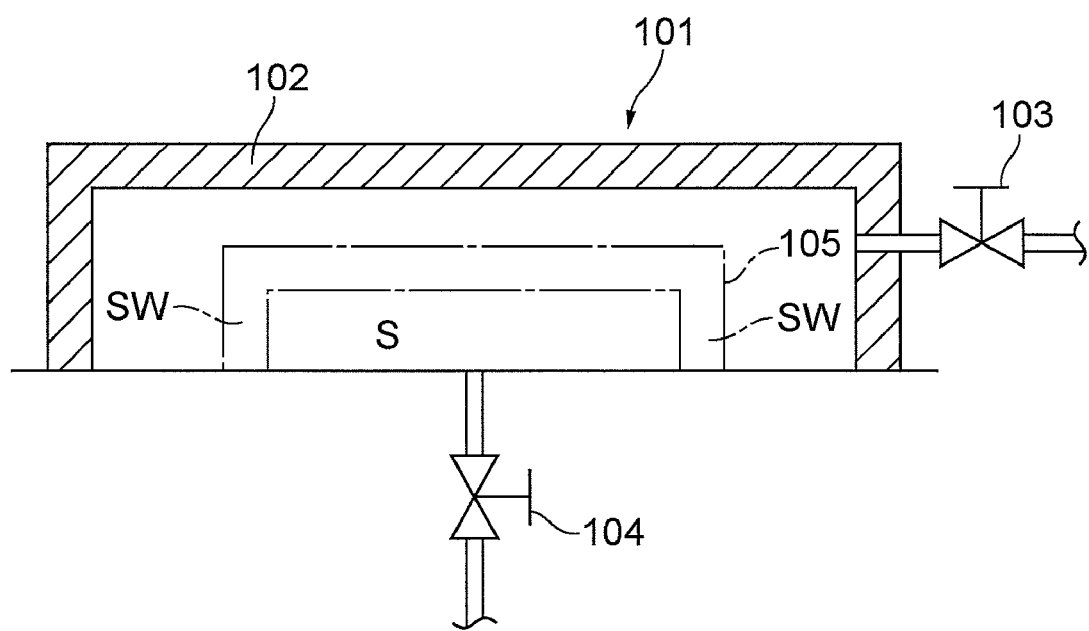
FIG. 12 is a model cross-section showing the configuration of an air-tightness testing unit used in air-tightness testing.

FIG. 12 is an outline showing air-tightness testing system 101 used in this air-tightness testing. As shown in FIG. 12, air-tightness testing system 101 comprises chamber 102, gas supply part 103 that supplies inactive He gas to the inside of chamber 102, and gas exhaust part 104 that exhausts air from the inside of chamber 102 through the bottom of chamber 102.

First, resin package 105 was arranged upside-down on the bottom of chamber 102 so that side walls SW of resin package 105 surrounded gas exhaust part 104 at the bottom of chamber 102. Next, the gas in space S formed by chamber 102 and the side walls SW of resin package 105 was removed by gas exhaust part 104, fixing resin package 105 to the bottom of chamber 102. Next, He was supplied to chamber 102 via gas supply part 103, and the air-tightness of the main body of the resin package was investigated by detecting He at gas exhaust part 104.

The results of this test are shown in Tables 1 and 2. The higher the air-tightness value in Table 1 below, the better the air-tightness of resin package 105. Give $\alpha_0$ as the number of manufactured resin packages 105 and $\alpha$ as the number of resin packages 105 exhibiting a He leak value less than $1 \times 10^{-8}$ Pa·m³/sec, air-tightness is given as $\alpha/\alpha_0 \times 100\%$.

TABLE 1

|  | Airtightness |
| --- | --- |
| Example 1 | 91% |
| Example 2 | 78% |
| Example 3 | 73% |
| Comparative Example 1 | 49% |
| Comparative Example 2 | 40% |

TABLE 2

|  | Airtightness |
| --- | --- |
| Example 4 | 71% |
| Example 5 | 43% |
| Example 6 | 24% |
| Comparative Example 3 | 15% |
| Comparative Example 4 | 3% |

It has been shown that because welds are unlikely to form using the lead frame of this embodiment of the invention, it is possible to manufacture a highly airtight high-quality resin package. That is, in Examples 1 through 3 air-tightness of 73% or more could be obtained when temperature $T1$ (° C.) was 300° C., while in Examples 4 through 6 air-tightness of 24% or more could be obtained when temperature $T1$ (° C.) was 261° C., and these values are higher than the air-tightness values obtained from the comparative examples under the same conditions (air-tightness 49% at $T1$=300 (° C.), air-tightness 15% at $T1$=261 (° C.)).

What is claimed is:

1. A lead frame applied during resin molding of a resin package having a polygonal plane shape, the lead frame comprising:
   an outer frame;
   a plurality of bonding leads extending from the outer frame towards an inside thereof;
   a die pad disposed inside the outer frame and separated from the bonding leads, wherein the die pad has four corners;
   four connecting leads linking the outer frame and the die pad, such that each of the connecting leads connects the outer frame to one of the corners of the die pad, wherein two of the connecting leads are bent, forming spaces between respective corners of the die pad and the outer frame;
   an excess resin reservoir comprising a through hole formed in the outer frame; and
   a pressure loss section which connects the excess resin reservoir with one of the spaces between a corner of the die pad and the outer frame, wherein the pressure loss section comprises a depression formed in the outer frame, the depression having a depth less than a thickness of the outer frame,
   wherein the pressure loss section extends in a first direction, the excess resin reservoir extends in a second direction, perpendicular to the first direction, and a width of the pressure loss section, defined in a direction perpendicular to the first direction and to a thickness direction of the outer frame, is smaller than a width of the excess resin reservoir, defined in a direction perpendicular to the second direction and to the thickness direction of the outer frame.

2. The lead frame according to claim 1, wherein each of the bent connecting leads comprises a first lead portion being parallel to a bonding lead adjacent to the first lead portion, and a second lead portion extending along a diagonal line passing through a respective corner of the die pad.

3. The lead frame according to one of claim 1 and claim 2, wherein a surface of the outer frame has been black-oxide treated.

4. The lead frame according to claim 1, wherein the die pad comprises a pair of diagonally opposite corners, a resin injection gate is arranged at a position corresponding to one of the diagonally opposite corners, and the pressure loss section is arranged at a position corresponding to the other of the diagonally opposite corners.

5. The lead frame according to claim 1, further comprising a groove extending in the first direction from an end of the excess resin reservoir.

* * * * *